US006702665B1

United States Patent
Tai

(10) Patent No.: US 6,702,665 B1
(45) Date of Patent: Mar. 9, 2004

(54) SYSTEM AND METHOD FOR THERMALLY REGULATING A COMPUTER RESPONSIVE TO A SENSOR FAILURE

(75) Inventor: Chang-Pen Tai, San Jose, CA (US)

(73) Assignee: Foundry Networks, Inc., Alviso, CA (US)

( * ) Notice: Subject to any disclaimer, the term of this patent is extended or adjusted under 35 U.S.C. 154(b) by 0 days.

(21) Appl. No.: 10/428,909

(22) Filed: May 2, 2003

(51) Int. Cl.[7] .................................................. F24F 7/00
(52) U.S. Cl. ........................ 454/256; 361/695; 454/184
(58) Field of Search .................................. 454/184, 185, 454/195, 256; 361/695, 696; 165/122, 80.2, 104.33; 312/236; 237/46

(56) References Cited

U.S. PATENT DOCUMENTS

| | | | | |
|---|---|---|---|---|
| 4,733,541 A | * | 3/1988 | Ismail et al. | 62/186 |
| 5,333,676 A | * | 8/1994 | Mizuno | 165/294 |
| 5,540,548 A | * | 7/1996 | Eberhardt et al. | 415/182.1 |
| 6,023,402 A | * | 2/2000 | Kaminski | 361/103 |

* cited by examiner

Primary Examiner—Derek Boles
(74) Attorney, Agent, or Firm—Thelen Reid & Priest LLP; J. Davis Gilmer

(57) ABSTRACT

A method and apparatus for thermally regulating a computing system responsive to a sensor failure is envisioned. The system has a fan. The system also has a sensor placed in the casing that is responsive to an environmental condition. A first circuit is coupled to the sensor and the fan, and is able to regulate the rotational speed at which the fan operates. The first circuit operates the fan at an increased rotational speed upon an indication of a failure of the sensor.

38 Claims, 4 Drawing Sheets

SYSTEM AND METHOD FOR THERMALLY REGULATING A COMPUTER RESPONSIVE TO A SENSOR FAILURE

FIELD OF THE INVENTION

The present invention is directed towards a thermal regulation system for a computing system. More specifically, the invention is directed towards a controlling failure conditions of a sensor or sensors associated with a thermal regulation system in a computing system.

BACKGROUND OF THE ART

In many typical computer systems, a casing protects the components from environmental damage. Within such a system, an electronic bus is provided and cards containing electronic circuits are coupled thereto. In this manner, the individual electronic cards may be swapped in and out as needed.

During operation of the electronic equipment, one problem that is encountered is heat buildup within the environment. The circuits used in electronic components radiate heat. This heat can be transferred to the immediate environment, but if the immediate environment heats up, far less heat transfer between the circuits and the environment is possible.

When operating in such an elevated temperature, such circuits are more prone to operational failure. In extreme cases, the circuit may fail completely and be rendered permanently inoperable.

Typically, to effectuate heat transfer from the electronic circuits, an airflow is created in the casing that houses the components. This airflow typically allows for greater heat transfer when more air is in contact with the heated circuit components. With this technique, heat is dissipated from the components into the air inside the casing, which is in turn heated. This heated air is then removed from the casing, allowing for cooler air to be drawn into the casing. In this manner an airflow that allows for both an enhanced heat transfer between the circuits and interior environment, as well as maintaining an effective heat transfer between the interior and exterior environments, is accomplished.

Computing systems typically use a thermal regulation system to aid with proper system operation. When the system overheats, the embedded electronic modules are subject to greater failure rates. Thus, a thermal regulation system that allows for the cooling of the electronic circuits and other components operates more efficiently and with a longer life.

As stated before, some computing systems contained within a casing contain a fan and vents to allow for such cooling functions. In some systems, the operational speed of the fan is kept constant. This assumes that the thermal characteristics in the casing of the computer unit remain relatively stable.

Other systems allow for a dynamic range of operational speeds of the thermal regulation system based upon the heat at some point or points within the casing itself. In these alternative systems, an indication of higher heat at a particular point within the casing of the computer unit initiates a higher operational speed of the thermal regulation system. This allows for the thermal regulation system to operate at a necessary and sufficient level.

However, of and when a sensor fails in these alternative units, the results may be problematic. If the thermal regulation system is operating at a particular operational level, the failure of the sensor may "freeze" the thermal regulation system at a particular level. If, after the sensor fails, the temperature characteristics within the case rise, the dynamic ability of the thermal regulation system to meet this increased temperature is defeated.

BRIEF DESCRIPTION OF THE INVENTION

A thermal regulation system for an electronic computing system within a casing is envisioned. The system has a fan. The system also has a sensor placed in the casing that is responsive to an environmental condition. A first circuit is coupled to the sensor and the fan, and is able to regulate the operational speed of the fan. The first circuit operates the fan at an increased operating speed upon an indication of a failure of the sensor.

BRIEF DESCRIPTION OF DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a system and method for thermally regulating a computer responsive to a sensor failure. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
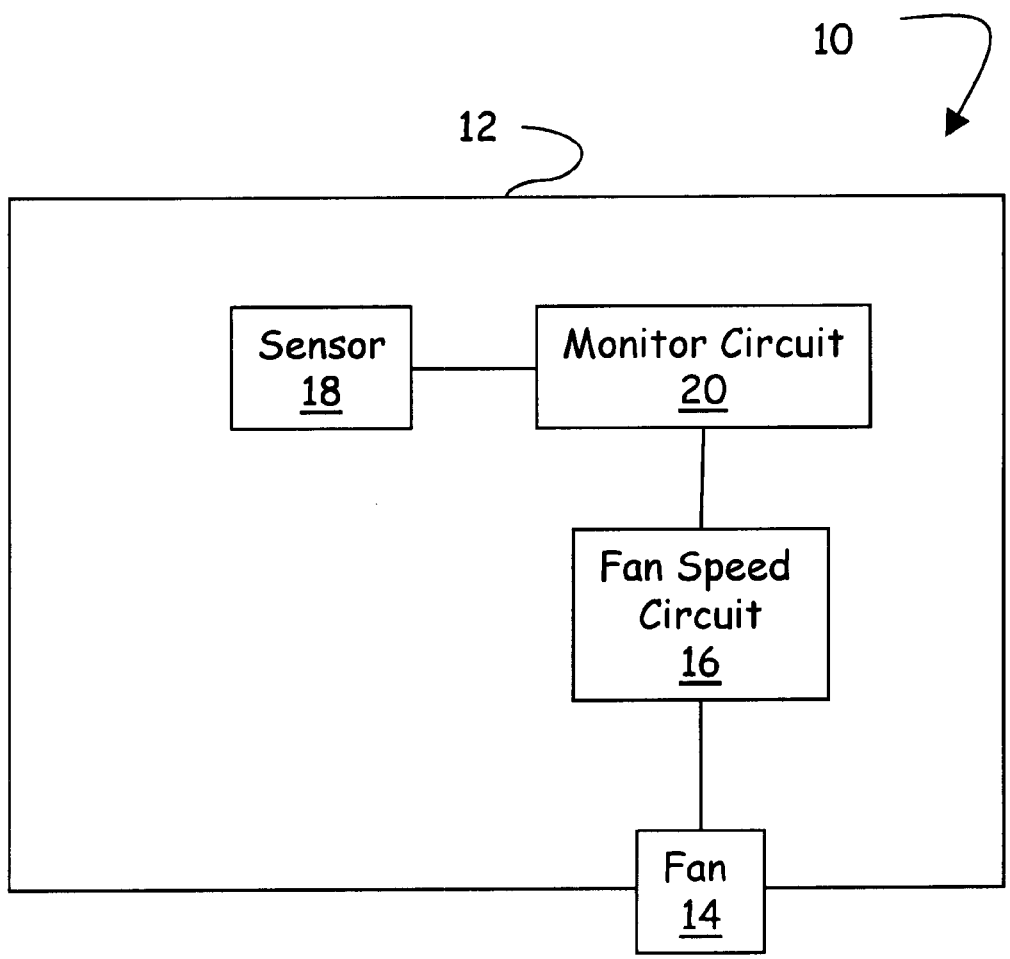
FIG. 1 is a schematic dramatic view of a thermal regulation system operating in accordance with the invention.

FIG. 1 is a schematic dramatic view of a thermal regulation system operating in accordance with the invention. A computing system 10 contains operational circuits, such as a CPU, memory, and many other functional components. The components of the computing system 10 are protected from environmental damage by an enclosure 12.

Disposed within the enclosure 12 is a fan 14. The fan 14 directs heated air from inside the enclosure 12 to an external environment. When the fan 14 directs heated air to the external environment, corresponding inflows of air into the enclosure 12 are created. In this manner cooler air replaces heated air expelled from the enclosure 12 by the fan 14.

A fan regulation circuit 16 is coupled to the fan 14. The fan regulation circuit 16 regulates the operational speed of the fan 14.

A sensor 18 is disposed within the enclosure 12 of the computing system 10. The sensor 18 is responsive to an environmental condition within the enclosure 12. The sensor 18 produces a signal based on the environmental conditions, such conditions including air flow, heat, or humidity, to name a few. Of course, other environmental conditions may be monitored by the sensor 18, and are known by those skilled in the art. The disclosure should be read as to include these other conditions as well, and not just those illustrated.

A monitor circuit 20 is coupled to the sensor 18. The monitor circuit is also coupled to the fan regulation circuit 16. The monitor circuit is able to monitor the status of the sensor 18.

The sensor 18 is responsive to the environmental conditions within the enclosure 12 of the computer 10. The sensor 18 produces a signal indicative of the environmental condition within the enclosure 12 of the computing system 10. The sensor 18 relays such a signal to the monitor circuit 20. The monitor circuit can then relay a control signal to the fan regulation circuit 16. The fan regulation circuit 16 might change the operational speed of the fan 14 in response to the status of the environmental condition in the enclosure 12, based on the particular output of the sensor 18.

Thus, when the sensor 18 indicates that a condition exists that calls for an increased operational speed of the fan 14, the fan regulation circuit 16 increases the operational speed of the fan 14. Conversely, when the sensor 18 indicates an environmental condition within the enclosure 12 that indicates a need for a lower operational speed of the fan 14, the fan regulation circuit 16 will initiate a lower operational speed of the fan 14.

In an embodiment of the invention, the monitor circuit 20 is responsive to not just the output of the sensor 18, but also to the operational status of the sensor 18 itself. Thus, when the sensor 18 fails, the monitor circuit 20 knows of this condition. This indication of a failure may be determined by a lack of a signal from the sensor 18, or other mechanisms may be envisioned.

When the monitor circuit 20 determines that the sensor 18 has failed, the monitor circuit 20 signals the fan regulation circuit 16 of this condition. In response, the fan regulation circuit 16 can increase the operational speed of the fan. In this manner, the monitor circuit 20 and the fan regulation circuit 16 can implement a "fail safe" mode of operation for the failure of the sensor 18.

In one embodiment, the fan regulation circuit 16 might increase the operational speed of the fan to the maximum allowable operational speed. In other embodiments, the fan regulation circuit may increase the operational speed of the fan to some other predetermined level other than the maximum level, increase the operational speed of the fan by a predetermined amount, or increase the operational speed of the fan by a predetermined amount based on some other parameter, such as the last reading of the particular failed sensor. The fan regulation circuit 16 may selectively determine the response based upon other sensor readings, or on previous readings from the now-failed sensor.

Of course, the course of action may also be determined by the monitor circuit 20. It should also be noted that the functionality of both the monitor circuit 20 and the fan regulation circuit 16 can be combined into one circuit. This combined circuit may take the form of a programmable array, a controller, a microprocessor, or any embodiment of hardware and/or software mentioned in the introductory paragraphs of this section of the disclosure.

Figure 2:
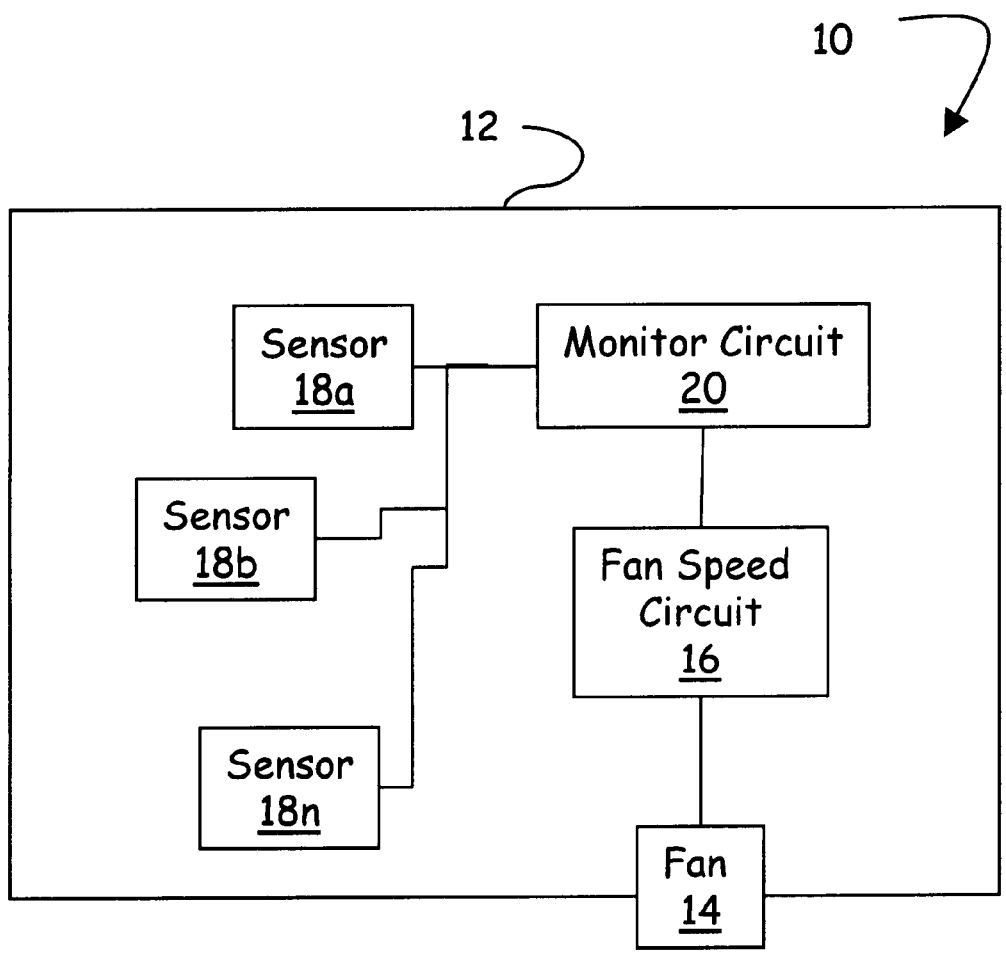
FIG. 2 is a schematic diagram of an alternative embodiment of the thermal regulation system in accordance with the invention.

FIG. 2 is a schematic diagram of an alternative embodiment of the thermal regulation system in accordance with the invention. In FIG. 2, the monitor circuit 20 is coupled to a plurality of sensors 18a–n. In this embodiment the monitor circuit 20 monitors the status of not just one sensor, but the status of the plurality of sensors. Accordingly, the response of the monitor circuit 20 and the fan regulation circuit 16 to the failure of any one or any combination of the sensor 18a–n may be completely defined.

For example, the monitor circuit 20 and the fan regulation circuit 16 may increase the operational speed of the fan when a certain number of sensors have indicated failure conditions. Or, any of the other responses defined above may be implemented based on the failure of any one sensor, or any group of sensors.

Figure 3:
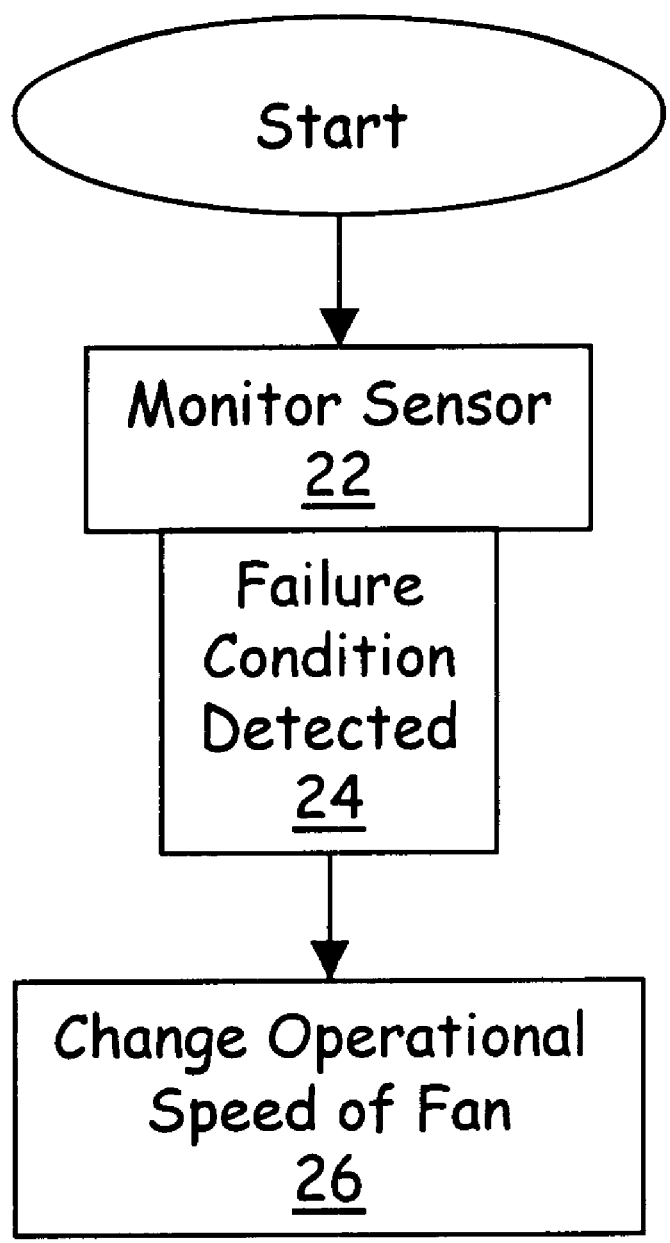
FIG. 3 is of a flow chart of an exemplary method by which the thermal regulation system may operate in accordance with the invention.

FIG. 3 is a flow chart of an exemplary method by which the thermal regulation system may operate in accordance with the invention. As the computing system starts, a normal operational state of the thermal regulation system is achieved in a block 22. This thermal regulation procedure continues until an indication of a failure of a sensor, such as that depicted in a block 24. Upon an indication of a failure, the thermal regulation system enters a block 26 in which it changes the operational speed of the fan.

Figure 4A:
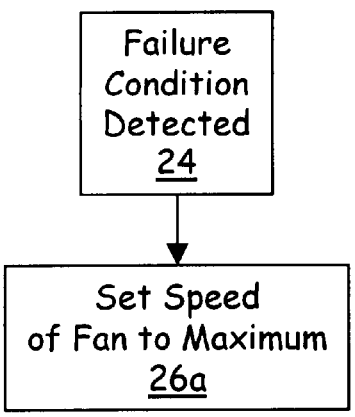
FIGS. 4a–d are flow charts detailing various operations of the system upon a failure detection in accordance with the invention.
Figure 4B:
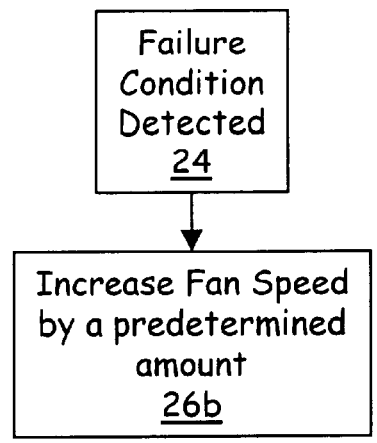
Figure 4D:
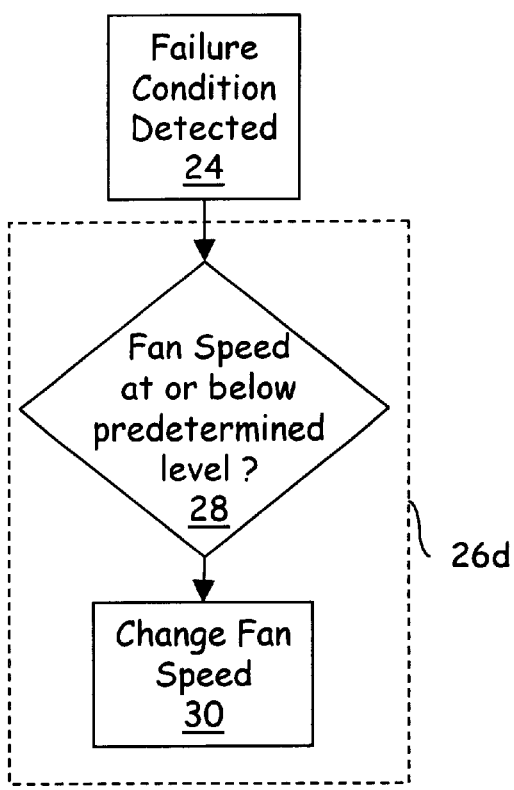
Figure 4C:
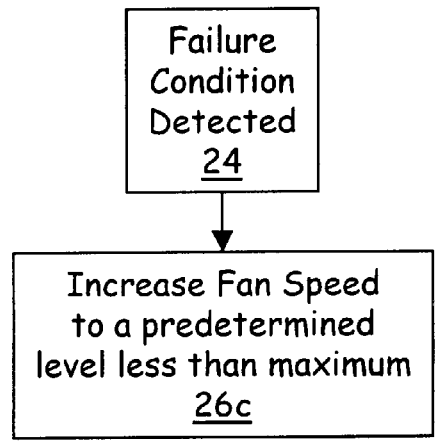

FIGS. 4a–c are flow diagrams detailing various operations of the system upon a failure detection in accordance with the invention. In one case, the change of operational state of the thermal regulation system under a failure condition may be to maximize the operational speed of the fan, such as that shown in a block 26a in FIG. 4a.

In an alternative aspect of the invention, the thermal regulation system may set the operational speed of the fan to a level above or below the current operational level of the fan. In this case the thermal regulation system may change the operational speed of the fan by a predetermined level, like that depicted in a block 26b in FIG. 4b.

In another alternative aspect of the invention, the thermal regulation system may set the operational speed of the fan at a level less than maximum. In this case the thermal regulation system may set the operational speed of the fan at a predetermined level, like that depicted in a block 26c in FIG. 4c.

In another alternative aspect of the invention, the thermal regulation system may selectively set the operational speed of the fan to a particular level. In this case the thermal regulation system may selectively set the operational speed of the fan to an operational level, like that depicted in a block 26d in FIG. 4d. First, in a block 28, the system determines if the current operating speed of the fan is at or above a predetermined level. Based on the result of the block 28, the system may set the operating level in a block 30. The function of this block 30 may take many forms, including those depicted in FIGS. 4a–4c.

It should be noted that the determination of a failure condition, such as those depicted in the block 24 of FIGS. 3, and 4a–c, may be defined as a failure in terms of a single sensor or in terms of a plurality of sensors. The failure condition associated with a plurality of sensors may be a failure of one sensor, a failure of a portion of a plurality of sensors, or a failure of a specified subgroup of the plurality of sensors.

Thus, an system and method for thermally regulating a computer responsive to a sensor failure is described and illustrated. Those skilled in the art will recognize that many modifications and variations of the present invention are possible without departing from the invention. Of course, the various features depicted in each of the figures and the accompanying text may be combined together. Accordingly, it should be clearly understood that the present invention is not intended to be limited by the particular features specifically described and illustrated in the drawings, but the concept of the present invention is to be measured by the scope of the appended claims. It should be understood that various changes, substitutions, and alterations could be made hereto without departing from the spirit and scope of the invention as described by the appended claims that follow.

While embodiments and applications of this invention have been shown and described, it would be apparent to these skilled in the art having the benefit of this disclosure that many more modifications than mentioned above are possible without departing from the inventive concepts herein. The invention, therefore, is not to be restricted except in the spirit of the appended claims.

Accordingly, what is claimed is:

1. A thermal regulation system for an electronic computing system with a casing, the system comprising:
   a fan;
   a sensor disposed in the casing and responsive to an environmental condition;
   a first circuit, coupled to said sensor and said fan, operable to regulate the rotational speed at which said fan operates;
   said first circuit operable to change said rotational speed of said fan upon an indication of failure of said sensor.

2. The thermal regulation system of claim 1 wherein the sensor is a heat sensor.

3. The thermal regulation system of claim 1 wherein the sensor is an air flow sensor.

4. The thermal regulation system of claim 3 wherein the sensor is heat sensor.

5. The thermal regulation system of claim 1 wherein the first circuit is a processor.

6. The thermal regulation system of claim 1 wherein the change of speed is a setting to a maximum speed.

7. The thermal regulation system of claim 1 wherein the change of speed is a setting to a predetermined speed.

8. The thermal regulation system of claim 1 wherein the change of speed is a changing of the speed by a predetermined amount.

9. The thermal regulation system of claim 1 wherein the change of speed is a dependent upon a current operational speed.

10. The thermal regulation system of claim 1, the sensor comprising a plurality of sensors.

11. The thermal regulation system of claim 10 wherein the failure is a failure of one of said plurality of sensors.

12. The thermal regulation system of claim 10 wherein the failure is a failure of a predetermined number of said plurality of sensors.

13. The thermal regulation system of claim 10 wherein the failure is a failure of a subgroup of said plurality of sensors.

14. A thermal regulation system for an electronic computing system with a casing, the system comprising:
   a means for expelling air from the casing;
   a means for sensing disposed in the casing and responsive to an environmental condition;
   a means for regulating, coupled to said means for sensing and said means for expelling, operable to regulate the rate at which said means for expelling operates;
   said means for regulating operable to change rate at which said means for expelling operates upon an indication of failure of said means for sensing.

15. The thermal regulation system of claim 14 wherein said means for sensing senses heat.

16. The thermal regulation system of claim 14 wherein said means for sensing senses air flow.

17. The thermal regulation system of claim 16 wherein said means for sensing senses heat.

18. The thermal regulation system of claim 14 wherein said means for regulating is a processor.

19. The thermal regulation system of claim 14 wherein the change of speed is a setting to a maximum speed.

20. The thermal regulation system of claim 14 wherein the change of rate is a setting to a predetermined speed.

21. The thermal regulation system of claim 14 wherein the change of rate is a changing of the speed by a predetermined amount.

22. The thermal regulation system of claim 14 wherein the change of rate is dependent upon a current operational rate of the means for expelling.

23. The thermal regulation system of claim 14, the means for sensing comprising a plurality of means for sensing.

24. The thermal regulation system of claim 23 wherein the failure is a failure of one of said plurality of means for sensing.

25. The thermal regulation system of claim 23 wherein the failure is a failure of a predetermined number of said plurality of means for sensing.

26. The thermal regulation system of claim 23 wherein the failure is a failure of a subgroup of said plurality of means for sensing.

27. A method for thermally regulating an electronic computing system with a casing and a fan, the method comprising:
   sensing an environmental condition in the casing;
   reading the status of the sensor;
   regulating an operational speed of the fan, based on said sensing;
   changing the operational speed of the fan, based upon said reading.

28. The method of claim 27 wherein said sensing comprises:
   sensing thermal characteristics.

29. The method of claim 27 wherein said sensing comprises:
   sensing air flow characteristics.

30. The method of claim 29 wherein said sensing comprises:
sensing thermal characteristics.

31. The method of claim 27 wherein said changing comprises:
setting the operational speed of the fan to a maximum speed.

32. The method of claim 27 wherein said changing comprises:
setting said operational speed of the fan to a predetermined speed.

33. The method of claim 27 wherein said changing comprises:
changing the operational speed of the fan by a predetermined amount.

34. The method of claim 27 wherein said changing comprises:
determining a current operational speed of the fan; and
based on said determining, changing the operational speed of the fan.

35. The method of claim 27 wherein said sensing is performed by a plurality of sensors.

36. The method of claim 35 wherein said reading comprises:
sensing a failure of one of said plurality of sensors.

37. The method of claim 35 wherein said reading comprises:
sensing a failure of a predetermined number of said plurality of sensors.

38. The method of claim 35 wherein said reading comprises: sensing a failure a subgroup of said plurality of sensors.

* * * * *

UNITED STATES PATENT AND TRADEMARK OFFICE
CERTIFICATE OF CORRECTION

PATENT NO. : 6,702,665 B1
DATED : March 9, 2004
INVENTOR(S) : Chang-Pen Tai

It is certified that error appears in the above-identified patent and that said Letters Patent is hereby corrected as shown below:

Column 1,
Line 66, replace "of" with -- if --.

Signed and Sealed this

Sixteenth Day of November, 2004

JON W. DUDAS
*Director of the United States Patent and Trademark Office*